US012592711B2

(12) United States Patent
Kadlimatti et al.

(10) Patent No.: US 12,592,711 B2
(45) Date of Patent: Mar. 31, 2026

(54) ASYNCHRONOUS ANALOG TO DIGITAL CONVERTER

(71) Applicant: Texas Instruments Incorporated, Dallas, TX (US)

(72) Inventors: Venkatesh Kadlimatti, Hubli (IN); Rinu Mathew, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 210 days.

(21) Appl. No.: 18/498,672

(22) Filed: Oct. 31, 2023

(65) Prior Publication Data

US 2025/0141462 A1 May 1, 2025

(51) Int. Cl.
| | |
|---|---|
| *H03M 1/00* | (2006.01) |
| *G05F 3/02* | (2006.01) |
| *H03M 1/12* | (2006.01) |
| *H03M 1/46* | (2006.01) |

(52) U.S. Cl.
CPC .............. *H03M 1/125* (2013.01); *G05F 3/02* (2013.01); *H03M 1/462* (2013.01)

(58) Field of Classification Search
CPC ...... H03M 1/125; H03M 1/366; H03M 1/687; H03M 1/745; H03M 1/0602; H03M 1/12; H03M 1/742; H03M 1/747; H03M 1/001; H03M 1/0604; H03M 1/0607; H03M 1/0612; H03M 1/0809; H03M 1/0863; H03M 1/122; H03M 1/146; H03M 1/147; H03M 1/34; H03M 1/36; H03M 1/365; H03M 1/38; H03M 1/44; H03M 1/447; H03M 1/46; H03M 1/462; H03M 1/66;
(Continued)

(56) References Cited

U.S. PATENT DOCUMENTS

| | | | | |
|---|---|---|---|---|
| 5,283,582 A | * | 2/1994 | Krenik .................. | H03M 1/366 341/158 |
| 6,002,354 A | * | 12/1999 | Itoh ....................... | H03M 1/785 341/154 |

(Continued)

FOREIGN PATENT DOCUMENTS

| | | |
|---|---|---|
| CN | 116192133 A | 5/2023 |
| CN | 114244370 B | 10/2024 |

OTHER PUBLICATIONS

International Search Report for PCT/US2023/086377 dated Jul. 22, 2024.

*Primary Examiner* — Linh V Nguyen
(74) *Attorney, Agent, or Firm* — Michelle F. Murray; Frank D. Cimino

(57) ABSTRACT

In described examples, an integrated circuit (IC) includes multiple subcircuits. The subcircuits include a first subcircuit that receives a current and sinks a portion of the current that is responsive to a threshold. In response to the current being greater than the threshold, the first subcircuit provides a difference between the current and the portion to a second subcircuit and asserts a signal corresponding to an ordinality of the first subcircuit. The second subcircuit is configured to repeat the actions with respect to the first subcircuit, with the second subcircuit in place of the first subcircuit and a third subcircuit in place of the second subcircuit, and with the difference in place of the current, in response to the IC comprising the third subcircuit.

20 Claims, 5 Drawing Sheets

(58) Field of Classification Search
CPC ........ H03M 1/664; H03M 1/68; H03M 1/765;
H03M 7/16; H03M 7/165
USPC ......................................... 341/134–136, 155
See application file for complete search history.

(56) References Cited

U.S. PATENT DOCUMENTS

| | | | | |
|---|---|---|---|---|
| 6,404,274 | B1 * | 6/2002 | Hosono | H02M 3/073 |
| | | | | 327/536 |
| 6,927,714 | B1 * | 8/2005 | Teterwak | H03M 1/0604 |
| | | | | 341/144 |
| 7,388,531 | B1 * | 6/2008 | Cyrusian | H03M 1/0604 |
| | | | | 341/144 |
| 7,595,684 | B2 * | 9/2009 | Maejima | G11C 16/30 |
| | | | | 327/536 |
| 10,726,927 | B2 * | 7/2020 | Murakami | H02M 3/07 |
| 10,804,921 | B1 | 10/2020 | Far | |
| 11,016,732 | B1 * | 5/2021 | Far | G06N 3/0499 |
| 11,144,316 | B1 * | 10/2021 | Far | H03M 1/742 |
| 2008/0136694 | A1 * | 6/2008 | Imai | H03M 1/0604 |
| | | | | 341/144 |
| 2010/0253561 | A1 * | 10/2010 | Mishra | H03M 1/0663 |
| | | | | 341/144 |
| 2011/0050967 | A1 | 3/2011 | Matsumoto | |
| 2016/0098057 | A1 | 4/2016 | Gambetta | |
| 2024/0295591 | A1 * | 9/2024 | Potlapalli | G01R 19/2513 |

* cited by examiner

ASYNCHRONOUS ANALOG TO DIGITAL CONVERTER

TECHNICAL FIELD

This application relates generally to analog to digital converters (singular ADC; plural ADCs), and more particularly to asynchronous voltage monitoring to provide a thermometric output.

BACKGROUND

Various types of circuits are controlled in response to a measured voltage. In some examples, voltage measurements can be used for control loop implementations for adjusting on or off switch timing, or to adjust parameters of voltage mode ramp compensation or pulse width modulation (PWM). Example applications for control loops responsive to voltage measurements include direct current to direct current (DC-DC) circuits such as buck, boost, or inverting buck-boost (IBB) power converters, or low drop-out (LDO) voltage regulators.

SUMMARY

In described examples, an integrated circuit (IC) includes multiple subcircuits. The subcircuits include a first subcircuit that receives a current and sinks a portion of the current that is responsive to a threshold. In response to the current being greater than the threshold, the first subcircuit provides a difference between the current and the portion to a second subcircuit and asserts a signal corresponding to an ordinality of the first subcircuit. The second subcircuit is configured to repeat the actions with respect to the first subcircuit, with the second subcircuit in place of the first subcircuit and a third subcircuit in place of the second subcircuit, and with the difference in place of the current, in response to the IC comprising the third subcircuit.

DETAILED DESCRIPTION

Figure 1:
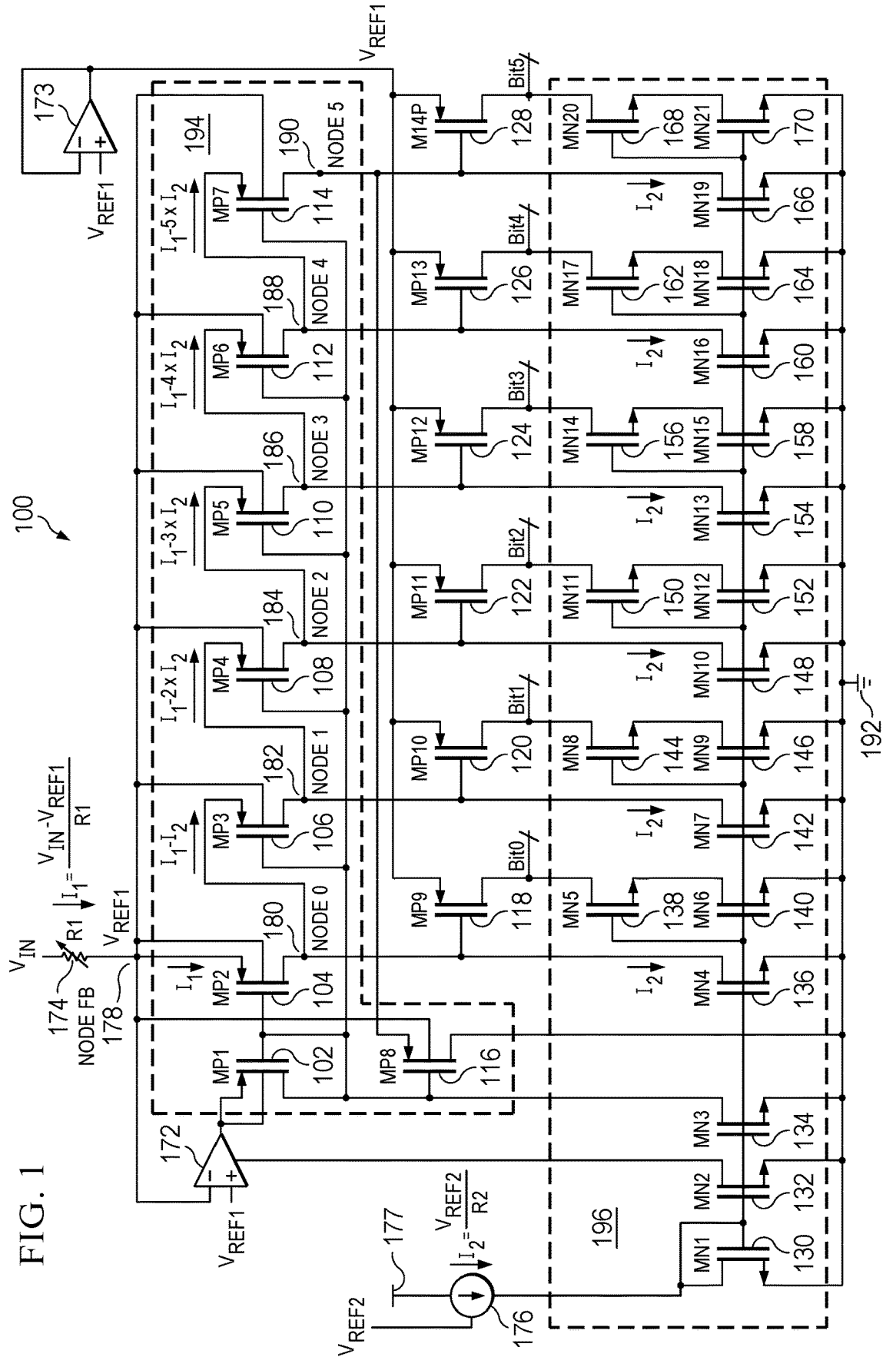
FIG. 1 is a circuit diagram of an example ADC.

In example voltage monitoring circuits described below, pairs of a first current and a second current are sequentially compared to determine a level of an input voltage that is related to the compared currents. In some examples, such as examples corresponding to a boost converter, the first current is responsive to a resistance of a first resistor and a difference between an input voltage (such as an input voltage of the boost converter) and a first reference voltage. In some examples, such as examples corresponding to a buck converter, the first current is responsive to the resistance of a first resistor and a difference between an input voltage (such as the input voltage of the buck converter) and an output voltage (such as an output voltage of the buck converter).

The second current is responsive to a resistance of a second resistor and a second reference voltage.

The first current is compared to the second current and one or more output bits in a set of N digital output bits is representative of the comparison. In an example, the voltage monitor circuit includes a set of cascaded subcircuits with increasingly higher thresholds that are each activated if the difference between the first current and the second current exceeds a threshold of a previous subcircuit. Thus, if the first current is less than the second current, all N output bits provide a logical zero voltage. If the first current is greater than the second current, then for the least significant of the N output bits, a node of a first subcircuit charges to enable a second comparison by a second subcircuit, and a first output bit (a first output line), corresponding to the least significant output bit, provides a logical one voltage. Next, the second subcircuit compares the first current minus the second current (the difference corresponding to a third current) to the second current. If the third current is less than the second current, all $N-1$ more significant output bits after the first output bit provide the logical zero voltage. If the third current is greater than the second current, a node charges to enable a third comparison, and the second output bit, corresponding to the $N-1$ bit, provides the logical one voltage. This process repeats for the remaining $N-2$ bits, with a current compared against the second current being decreased by the second current after each comparison that results in a logical one voltage output. Accordingly, current left over after each comparison is used in place of the first current in the sequentially next comparison. If a last comparison of the sequence results in a corresponding last output bit providing a logical one voltage, potentially resulting in excess current, the excess current is provided to ground.

Accordingly, the output bits, which are sequentially activated in response to an increasing level of the input voltage (to which a level of the first current is responsive), provide a thermometer output of the voltage monitoring circuit. In a four-bit example, a lowest output value is 0000, a next higher value is 0001, then 0011, then 0111, and a maximum output value is 1111, so that the number of ones in the output rises with rising voltage (like mercury rises with temperature in a mercury thermometer).

FIG. 1 is a circuit diagram of an example ADC 100. In some examples, the ADC 100 is used as a voltage monitoring circuit. Metal-oxide-semiconductor field-effect transistors (MOSFETS) are numbered as M[channel type][number], where the number increases for each differing transistor of a same channel type. Channel types include n-channel MOSFETS (NMOS) and p-channel MOSFETS (PMOS). The channel type for each transistor is only an example, and other examples may substitute another transistor of a different type for any illustrated transistor.

The ADC 100 includes a first p-channel MOSFET (MP1) 102, a second p-channel MOSFET (MP2) 104, a third p-channel MOSFET (MP3) 106, a fourth p-channel MOSFET (MP4) 108, a fifth p-channel MOSFET (MP5) 110, a sixth p-channel MOSFET (MP6) 112, a seventh p-channel MOSFET (MP7) 114, an eighth p-channel MOSFET (MP8) 116, a ninth p-channel MOSFET (MP9) 118, a tenth p-channel MOSFET (MP10) 120, an eleventh p-channel MOSFET (MP11) 122, a twelfth p-channel MOSFET (MP12) 124, a thirteenth p-channel MOSFET (MP13) 126, and a fourteenth p-channel MOSFET (MP14) 128.

Further, the ADC 100 includes a first n-channel MOSFET (MN1) 130, a second n-channel MOSFET (MN2) 132, a third n-channel MOSFET (MN3) 134, a fourth n-channel MOSFET (MN4) 136, a fifth n-channel MOSFET (MN5)

138, a sixth n-channel MOSFET (MN6) 140, a seventh n-channel MOSFET (MN7) 142, an eighth n-channel MOSFET (MN8) 144, a ninth n-channel MOSFET (MN9) 146, a tenth n-channel MOSFET (MN10) 148, an eleventh n-channel MOSFET (MN11) 150, a twelfth n-channel MOSFET (MN12) 152, a thirteenth n-channel MOSFET (MN13) 154, a fourteenth n-channel MOSFET (MN14) 156, a fifteenth n-channel MOSFET (MN15) 158, a sixteenth n-channel MOSFET (MN16) 160, a seventeenth n-channel MOSFET (MN17) 162, an eighteenth n-channel MOSFET (MN18) 164, a nineteenth n-channel MOSFET (MN19) 166, a twentieth n-channel MOSFET (MN20) 168, and a twenty-first n-channel MOSFET (MN21) 170.

Also, the ADC 100 includes a first error amplifier 172 (for example, an operational amplifier, or op-amp), a second error amplifier 173 (such as an op-amp), a variable resistor 174 with the resistance once set indicated as R1, a current source 176, and a voltage source 177. In some examples, the resistance R1 changes, or is controlled (for example, trimmed), depending on a process used to manufacture the variable resistor 174, for example where the variable resistor 174 is implemented using a PMOS or NMOS process. In some examples, R1 equals 10 kiloohms (10 kΩ). In some examples, a variable resistor 174 manufactured using PMOS is faster than a variable resistor 174 manufactured using NMOS. In some examples, R1 is trimmed in response to testing post-fabrication, such as in response to a designed current ($I_1$) through the variable resistor 174. In some examples, the ADC 100 is manufactured as part of an IC.

A non-inverting input of the first error amplifier 172 receives a first reference voltage $V_{REF1}$. An output of the first error amplifier 172 is connected to a back gate (bulk terminal) and a source of MP1 102. In some examples, $V_{REF1}$ is generated using a bandgap voltage. An inverting input of the first error amplifier 172 is connected to a feedback node (node FB) 178. The first error amplifier 172 is connected (as further detailed below) so that negative reinforcement causes a voltage at the inverting input of the first error amplifier 172, and accordingly at node FB 178, to equal the voltage $V_{REF1}$ received by the non-inverting input of the first error amplifier 172. A drain of MN2 132 is connected to a bias terminal of the first error amplifier 172 so that MN2 132, which is part of a current mirror with MN1 130 (as further described below), provides a corresponding bias current to the first error amplifier 172.

Node FB 178 is connected to a second terminal of the variable resistor 174, to a source of MP2 104, and to back gates of MP2 104, MP3 106, MP4 108, MP5 110, MP6 112, MP7 114, and MP8 116. A drain of MP1 102 is connected to a drain of MN3 134 and to gates of MP2 104, MP3 106, MP4 108, MP5 110, MP6 112, MP7 114, and MP8 116. Accordingly, MP1 102 is diode-connected so that MP1 102, MP2 104, MP3 106, MP4 108, MP5 110, MP6 112, MP7 114, and MP8 116, which are matched, are together a first current mirror 194. A first terminal of the variable resistor 174 receives a voltage $V_{IN}$. $V_{IN}$ is the voltage monitored by the ADC 100.

A non-inverting input of the second error amplifier 173 receives $V_{REF1}$. An inverting input and an output of the second error amplifier 173 are connected together and to sources of MP9 118, MP10 120, MP11 122, MP12 124, MP13 126, and MP14 128. Accordingly, the second error amplifier 173 is connected so that negative feedback causes the output of the second error amplifier 173 to equal $V_{REF1}$, which is provided to the sources of MP9 118, MP10 120, MP11 122, MP12 124, MP13 126, and MP14 128. In some examples, the second error amplifier 173 is used to avoid MP9 118, MP10 120, MP11 122, MP12 124, MP13 126, and/or MP14 128 drawing sufficient current from node FB 178 to affect results of the ADC 100.

A node 0 180 is connected to a drain of MP2 104, a source of MP3 106, a gate of MP9 118, and a drain of MN4 136. A node 1 182 is connected to a drain of MP3 106, a source of MP4 108, a gate of MP10 120, and a drain of MN7 142. A node 2 184 is connected to a drain of MP4 108, a source of MP5 110, a gate of MP11 122, and a drain of MN10 148. A node 3 186 is connected to a drain of MP5 110, a source of MP6 112, a gate of MP12 124, and a drain of MN13 154. A node 4 188 is connected to a drain of MP6 112, a source of MP7 114, a gate of MP13 126, and a drain of MN16 160. A node 5 190 is connected to a drain of MP7 114, a source of MP8 116, a gate of MP14 128, and a drain of MN19 166.

A drain of MP9 118 is connected to a drain of MN5 138 and provides a first output/Bit0 (read as bit zero bar, which means inverted bit zero). A drain of MP10 120 is connected to a drain of MN8 144 and provides a second output/Bit1. A drain of MP11 122 is connected to a drain of MN11 150 and provides a third output/Bit2. A drain of MP12 124 is connected to a drain of MN14 156 and provides a fourth output/Bit3. A drain of MP13 126 is connected to a drain of MN17 162 and provides a fifth output/Bit4. A drain of MP14 128 is connected to a drain of MN20 168 and provides a sixth output/Bit5. /Bit0, /Bit1, /Bit2, /Bit3, /Bit4, and/Bit5 are inverted outputs, so that each corresponds to a logical one when at a relatively low voltage, such as a zero voltage or other ground voltage, and each corresponds to a logical zero when at a relatively high voltage, such as $V_{REF1}$.

A source of MN5 138 is connected to a drain of MN6 140. A source of MN8 144 is connected to a drain of MN9 146. A source of MN11 150 is connected to a drain of MN11 152. A source of MN14 156 is connected to a drain of MN15 158. A source of MN17 162 is connected to a drain of MN18 164. A source of MN20 168 is connected to a drain of MN21 170.

A ground 192 is connected to sources of MN1 130, MN2 132, MN3 134, MN4 136, MN6 140, MN7 142, MN9 146, MN10 148, MN12 152, MN13 154, MN15 158, MN16 160, MN18 164, MN19 166, and MN21 170. A gate and drain of MN1 130 are connected to a second terminal of the current source 176, and to gates of MN2 132, MN3 134, MN4 136, MN5 138, MN6 140, MN7 142, MN8 144, MN9 146, MN10 148, MN11 150, MN12 152, MN13 154, MN14 156, MN15 158, MN16 160, MN17 162, MN18 164, MN19 166, MN20 168, and MN21 170. Accordingly, MN1 130 is diode-connected so that it is part of a second current mirror 196 together with MN2 132, MN3 134, MN4 136, MN5 138, MN6 140, MN7 142, MN8 144, MN9 146, MN10 148, MN11 150, MN12 152, MN13 154, MN14 156, MN15 158, MN16 160, MN17 162, MN18 164, MN19 166, MN20 168, and MN21 170, with each of which MN1 130 is matched.

A first terminal of the current source 176 is connected to the voltage source 177, and a control terminal of the current source 176 receives a second reference voltage $V_{REF2}$. Generation of the current $I_2$ provided by the current source 176 includes providing $V_{REF2}$ across a resistance R2, such as a resistance provided by a second resistor such as variable resistor 510 (see FIG. 5). Accordingly, a supply-dependent current $I_1$ and a reference current $I_2$ of the ADC 100 both depend on resistors of the same type, so that effects of process and temperature variations on comparisons between $I_1$ and $I_2$ are reduced or canceled out.

The voltage across the variable resistor 174 equals the difference between the voltage $V_{IN}$ received by the first terminal of the variable resistor 174, and the voltage at node FB 178 at the second terminal of the variable resistor 174.

If $V_{IN}$ is less than $V_{REF1}$, the voltage at node FB 178 follows (equals) $V_{IN}$, a current ($I_1$) through the variable resistor 174 equals zero, and MP2 104 is turned off. If $V_{IN}$ is greater than $V_{REF1}$, MP2 104 turns on and the error amplifier 172 regulates the voltage at node FB 178 to equal $V_{REF1}$. Accordingly, while $V_{IN}$ is greater than $V_{REF1}$, $I_1$ is given by $I_1 = (V_{IN} - V_{REF1})/R1$. Regulation of the voltage at node FB 178 by the error amplifier 172 is further described below.

In some examples, the current $I_2$ provided by the current source 176 is generated responsive to the voltage $V_{REF2}$ across the second resistor with resistance R2. Accordingly, $I_2$ is given by $I_2 = V_{REF2}/R2$. The current source 176 is further described with respect to FIG. 5.

MN1 130 is turned on deep in the saturation region during operation of the ADC 100. Because MN1 130 is diode-connected, the other MOSFETs in the second current mirror 196 also turn on deep in the saturation region, and conduct a current responsive to 12. In some examples, a current mirror multiplier of MN4 136, MN7 142, MN10 148, MN13 154, MN16 160, and MN19 166 equals one, so that currents through these transistors equal the current ($I_2$) through MN1 130. In some examples, current mirror multipliers of MN5 138 and MN6 140, MN8 144 and MN9 146, MN11 150 and MN12 152, MN14 156 and MN15 158, MN17 162 and MN18 164, and MN20 168 and MN21 170, are equal and are less than one. Note that this latter list of transistors is described in pairs, because each pair is connected source to drain in series between a respective one of MP9 118, MP10 120, MP11 122, MP12 124, MP13 126, or MP14 128, and ground 192.

An example current mirror multiplier of the described pairs of transistors is ¼ (one quarter). In some examples, the current mirror multiplier of the described pairs of transistors is less than one to reduce a current usage, and accordingly a power consumption, of the ADC 100. In some examples, the current mirror multiplier of the described pairs of transistors is balanced between a budgeted power consumption of the ADC 100 and a speed of the ADC 100. In some examples, a speed of the ADC 100 is responsive to a speed with which the described pairs of transistors can discharge a respective output line corresponding to/Bit0, /Bit1, /Bit2, /Bit3, /Bit4, or/Bit5 to change the corresponding output line from having a source voltage ($V_{REF1}$) representing a logical zero to having a ground voltage representing a logical one.

The first error amplifier 172 provides a voltage to the source of MP1 102 so that a gate-source voltage ($V_{GS}$) of MP1 102 causes MP1 102 to stay in saturation or sub-threshold region (deep in the saturation region) when its gate is discharged, and so that the voltage at node FB 178 equals the voltage received by the non-inverting input of the first error amplifier 172. As earlier described, a bias terminal of the first error amplifier 172 is diode-connected and $I_2$ flows through MN3 134 towards ground. Control by the error amplifier 172 of the gate voltage of MP1 102 similarly controls the gate voltage of MP2 104. This affects the $V_{GS}$ of MP2 104, as well as the source voltage of MP2 104. Accordingly, while $V_{IN}$ is greater than $V_{REF1}$ so that MP1 102 is turned on, the first error amplifier 172 regulates the voltage at node FB 178 to equal $V_{REF1}$.

MP1 102 shares a gate voltage with MP2 104, MP3 106, MP4 108, MP5 110, MP6 112, MP7 114, and MP8 116. The back gate connections of MP2 104, MP3 106, MP4 108, MP5 110, MP6 112, MP7 114, and MP8 116 to node FB 178 adjust the threshold voltages at respective gates of these transistors so that if MP2 104, MP3 106, MP4 108, MP5 110, MP6 112, MP7 114, or MP8 116 turns on (activates), the activated transistor will operate deep in the saturation region. In some examples, when a MOSFET operates deep in the saturation region, it is fully turned on so that its source-drain path has little or no resistance, similar to a shorted line. Accordingly, MP2 104, MP3 106, MP4 108, MP5 110, MP6 112, MP7 114, or MP8 116 act like switches, so that they are either fully turned on (no or little resistance) or fully turned off (tending toward infinite resistance).

MP1 102 acts as a level shifter for the output of the error amplifier 172, raising the voltage at the output of the error amplifier 172 above the gate voltage of the MOSFETS of the PMOS transistors of the first current mirror 194 by the voltage drop across the diode-connected MP1 102. In some examples, this improves stable biasing of an output stage of the error amplifier 172. Also, MP1 102 provides a discharge path for the gates of the PMOS of the first current mirror 194 and for the output of the error amplifier 172.

Each of MP2 104, MP3 106, MP4 108, MP5 110, MP6 112, MP7 114, and MP8 116 is respectively connected in series, drain to source, between node FB 178 and ground 192, and their gates are connected to the gate of MP1 102. The drains of MP2 104, MP3 106, MP4 108, MP5 110, MP6 112, and MP7 114 are respectively connected to the drains of MN4 136, MN7 142, MN10 148, MN13 154, MN16 160, and MN19 166. As described above, as a result of the second current mirror 196, $I_2$ flows from drain to source through each of MN4 136, MN7 142, MN10 148, MN13 154, MN16 160, and MN19 166. Accordingly, the drains of MP2 104, MP3 106, MP4 108, MP5 110, MP6 112, and MP7 114 sink $I_2$.

Comparisons are successively (sequentially) made at node 0 180, node 1 182, node 2 184, node 3 186, node 4 188, and node 5 190, starting with node 0 108, between $I_2$ and currents received at the respective sources of MP2 104, MP3 106, MP4 108, MP5 110, MP6 112, and MP7 114. In the illustrated example, the sequence is comparing the current received at the source of MP2 104 to $I_2$ at node 0 180, then comparing the current received at the source of MP3 106 (which may be substantially equal to the current at the source of MP2 104 minus $I_2$) to $I_2$ at node 1 182, then if the current at the source of MP3 106 is greater than $I_2$, comparing the current received at the source of MP4 108 (which may be substantially equal to the current at the source of MP3 106 minus $I_2$) to $I_2$ at node 2 184, then comparing the current received at the source of MP5 110 (which may be substantially equal to the current at the source of MP4 108 minus $I_2$) to $I_2$ at node 3 186, then comparing the current received at the source of MP6 112 (which may be substantially equal to the current at the source of MP5 110 minus $I_2$) to $I_2$ at node 4 188, then comparing the current received at the source of MP7 114 (which may be substantially equal to the current at the source of MP6 112 minus $I_2$) to $I_2$ at node 5 190.

For each of MP2 104, MP3 106, MP4 108, MP5 110, MP6 112, and MP7 114, if its source-received current is greater than $I_2$, then a voltage at one of node 0 180, node 1 182, node 2 184, node 3 186, node 4 188, or node 5 190 connected to the drain of the respective transistor charges to $V_{REF1}$, a next transistor in the sequence turns on, and a remainder current is provided to the next transistor in the sequence. The next transistor in the sequence turns on as the increasing voltage of the charging node causes the $V_{GS}$ of the next transistor in the sequence to meet the corresponding threshold voltage. The remainder current equals the source-received current minus $I_2$.

The comparison made at node 0 180 is given by Equation 1. The comparison made at node 1 182 is given by Equation 2. The comparison made at node 2 184 is given by Equation 3. The comparison made at node 3 186 is given by Equation 4. The comparison made at node 4 188 is given by Equation 5. The comparison made at node 5 190 is given by Equation 6. The node making the respective comparison charges, turning on the next PMOS in the sequence, if the logic value of the comparison, as given by a respective one of Equations 1 through 6, is true. These comparisons, and their results, are further described below in order, starting with node 0 180 and MP2 104 (Equation 1).

$$I_1 > I_2 \qquad \text{Equation 1}$$

$$I_1 - I_2 > I_2 \qquad \text{Equation 2}$$

$$I_1 - 2 \times I_2 > I_2 \qquad \text{Equation 3}$$

$$I_1 - 3 \times I_2 > I_2 \qquad \text{Equation 4}$$

$$I_1 - 4 \times I_2 > I_2 \qquad \text{Equation 5}$$

$$I_1 - 5 \times I_2 > I_2 \qquad \text{Equation 6}$$

Currents from node FB 178 to paths other than the source-drain path of MP2 104 are negligible, unless $I_1 - 5 \times I_2 > I_2$, in which case excess current flows through MP8 116.

$I_1$ flows to the source of MP2 104 and $I_2$ flows through MN4 136 from drain to source. If $I_1$ is greater than $I_2$ (Equation 1), then node 0 180 charges to $V_{REF1}$ so that MP9 118 turns off (the $V_{GS}$ of MP9 118 rises to zero, above the threshold voltage) and MP3 106 turns on, and a remainder current $I_1$ minus $I_2$ ($I_1 - I_2$) is provided to the source of MP3 106. If MP9 118 is off, then the current through MN5 138 and MN6 140 discharges/Bit0 to zero voltage, which corresponds to logical one. If $I_1$ is less than $I_2$, then MP9 118 turns on. If MP9 118 is on, then the output of the second error amplifier 173 charges/Bit0 to $V_{REF1}$, which corresponds to logical zero.

As described above, the currents through MN5 138 and MN6 140, and through the similarly situated pairs of transistors with gates connected to the gate of the diode-connected MN1 130, are proportional to (or responsive to) $I_2$. As described below, similar comparisons are made between currents through other PMOS transistors of the first current mirror 194 and currents through corresponding other NMOS transistors of the second current mirror 196, with currents to PMOS sources being incrementally decreased by $I_2$. Accordingly, similar state changes resulting from these comparisons cause similar outputs with respect to node 1 182, node 2 184, node 3 186, node 4 188, and node 5 190, and transistors connected to those nodes.

$I_2$ flows through MN7 142 from drain to source. As described, if $I_1$ is greater than $I_2$, then $I_1 - I_2$ is provided to the source of MP3 106 and MP3 106 turns on. In this case, if $I_1 - I_2$ is greater than $I_2$ (Equation 2), then node 1 182 charges to $V_{REF1}$ so that MP10 120 turns off (the $V_{GS}$ of MP10 120 goes to zero) and MP4 108 turns on, and a remainder current $I_1 - I_2$ minus $I_2$ ($I_1 - 2 \times I_2$) is provided to the source of MP4 108. If MP10 120 is off, then the current through MN8 144 and MN9 146 discharges/Bit1 to zero voltage, which corresponds to logical one. If $I_1 - I_2$ is less than $I_2$, then MP10 120 turns on. If MP10 120 is on, then the output of the second error amplifier 173 charges/Bit1 to $V_{REF1}$, which corresponds to logical zero.

$I_2$ flows through MN10 148 from drain to source. As described, if $I_1 - I_2$ is greater than $I_2$, then $I_1 - 2 \times I_2$ is provided to the source of MP4 108 and MP4 108 turns on. In this case, if $I_1 - 2 \times I_2$ is greater than $I_2$ (Equation 3), then node 2 184 charges to $V_{REF1}$ so that MP11 122 turns off (the $V_{GS}$ of MP11 122 goes to zero) and MP5 110 turns on, and a remainder current $I_1 - 2 \times I_2$ minus $I_2$ ($I_1 - 3 \times I_2$) is provided to the source of MP5 110. If MP11 122 is off, then the current through MN11 150 and MN12 152 discharges/Bit2 to zero voltage, which corresponds to logical one. If $I_1 - 2 \times I_2$ is less than 12, then MP11 122 turns on. If MP11 122 is on, then the output of the second error amplifier 173 charges/Bit2 to $V_{REF1}$, which corresponds to logical zero.

$I_2$ flows through MN13 154 from drain to source. As described, if $I_1 - 2 \times I_2$ is greater than $I_2$, then $I_1 - 3 \times I_2$ is provided to the source of MP5 110 and MP5 110 turns on. In this case, if $I_1 - 3 \times I_2$ is greater than $I_2$ (Equation 4), then node 3 186 charges to $V_{REF1}$ so that MP12 124 turns off (the $V_{GS}$ of MP12 124 goes to zero) and MP6 112 turns on, and a remainder current $I_1 - 3 \times I_2$ minus $I_2$ ($I_1 - 4 \times I_2$) is provided to the source of MP6 112. If MP12 124 is off, then the current through MN14 156 and MN15 158 discharges/Bit3 to zero voltage, which corresponds to logical one. If $I_1 - 3 \times I_2$ is less than 12, then MP12 124 turns on. If MP12 124 is on, then the output of the second error amplifier 173 charges/Bit3 to $V_{REF1}$, which corresponds to logical zero.

$I_2$ flows through MN16 160 from drain to source. As described, if $I_1 - 3 \times I_2$ is greater than $I_2$, then $I_1 - 4 \times I_2$ is provided to the source of MP6 112 and MP6 112 turns on. In this case, if $I_1 - 4 \times I_2$ is greater than $I_2$ (Equation 5), then node 4 188 charges to $V_{REF1}$ so that MP13 126 turns off (the $V_{GS}$ of MP13 126 goes to zero) and MP7 114 turns on, and a remainder current $I_1 - 4 \times I_2$ minus $I_2$ ($I_1 - 5 \times I_2$) is provided to the source of MP7 114. If MP13 126 is off, then the current through MN17 162 and MN18 164 discharges/Bit4 to zero voltage, which corresponds to logical one. If $I_1 - 4 \times I_2$ is less than $I_2$, then MP13 126 turns on. If MP13 126 is on, then the output of the second error amplifier 173 charges/Bit4 to $V_{REF1}$, which corresponds to logical zero, by.

$I_2$ flows through MN19 166 from drain to source. As described, if $I_1 - 4 \times I_2$ is greater than $I_2$, then $I_1 - 5 \times I_2$ is provided to the source of MP7 114 and MP7 114 turns on. In this case, if $I_1 - 5 \times I_2$ is greater than $I_2$ (Equation 6), then node 5 190 charges to $V_{REF1}$ so that MP14 128 turns off (the $V_{GS}$ of MP14 128 goes to zero) and MP8 116 turns on, and a remainder current $I_1 - 5 \times I_2$ minus $I_2$ ($I_1 - 6 \times I_2$) is provided to ground 192 via MP8 116. Accordingly, current in excess of a current that causes all available output bits to indicate logical one is provided to ground 192. If MP14 128 is off, then the current through MN20 168 and MN21 170 discharges/Bit5 to zero voltage, which corresponds to logical one. If $I_1 - 5 \times I_2$ is less than $I_2$, then MP14 128 turns on. If MP14 128 is on, then the output of the second error amplifier 173 charges/Bit5 to $V_{REF1}$, which corresponds to logical zero.

In some examples, PMOS of the first current mirror 194 can, together with corresponding NMOS of the second current mirror 196, be described as subcircuits of the ADC 100. Drains of PMOS of the first current mirror 194 are connected to drains of corresponding NMOS of the second current mirror 196. Accordingly, MP2 104 and MN4 136 form a first subcircuit, MP3 106 and MN7 142 form a second subcircuit, and so on, through MP7 114 and MN19 166, which form a sixth subcircuit.

Each subcircuit receives a current, sinks a portion of the current that is responsive to a threshold, and in response to the current being greater than the threshold, provides a difference between the current and the portion to a second subcircuit, and asserts an output signal corresponding to an ordinality of the first subcircuit. For example, MP2 104 receives $I_1$, MN4 136 sinks 12, and if $I_1 > I_2$, then $I_1 - I_2$ is provided to MP3 106 and/Bit0 is asserted to a logical one. Ordinality of the subcircuit refers to the order in which comparisons are performed by the subcircuits, such as the first subcircuit (MP2 104 and MN4 136), the second subcircuit (MP3 106 and MN7 142), the third subcircuit (MP4 108 and MN10 148), and so on.

In some examples, the first and second current mirrors 194 and 196 can be implemented using relatively small MOSFET devices and with a relatively small number of MOSFET devices, enabling reduced parasitic capacitance and a relatively small area budget. Also, the current comparison as described is asynchronous (in some examples, does not require a clock), enhancing reduction in complexity. Further, described circuits enable fast performance, relatively low power usage, and relatively low supply voltage requirements, such as a 1 volt supply.

Figure 2:
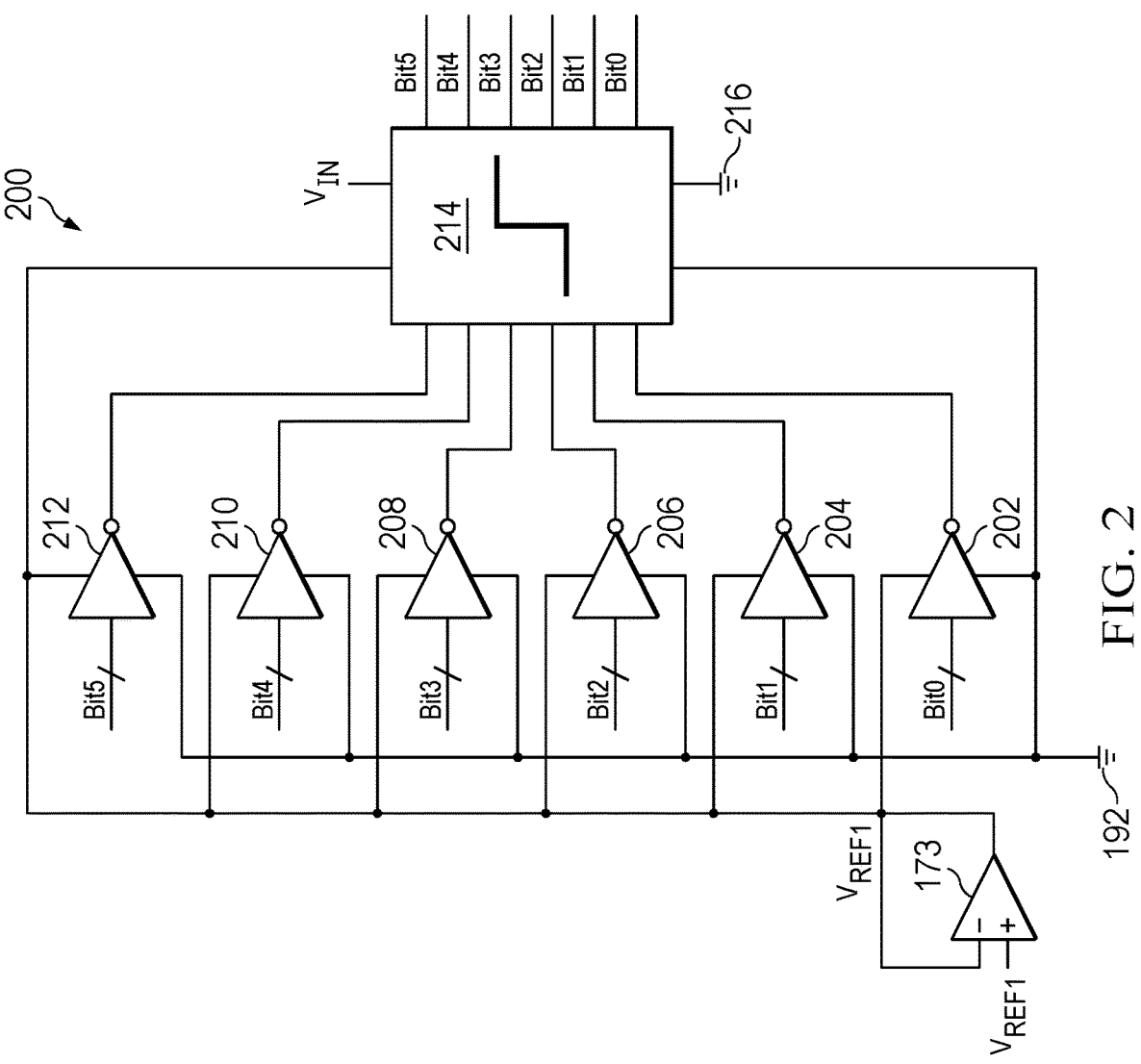
FIG. 2 is a circuit diagram of an example output circuit of the ADC of FIG. 1.

FIG. 2 is a circuit diagram of an example output circuit 200 of the ADC 100 of FIG. 1. The output circuit 200 includes the second error amplifier 173, the ground 192 (a first ground 192), a first inverter 202, a second inverter 204, a third inverter 206, a fourth inverter 208, a fifth inverter 210, a sixth inverter 212, a level shifter 214, and a second ground 216 that is electrically isolated from the first ground 192. As previously described, the non-inverted input of the error amplifier 173 receives $V_{REF1}$, and the inverted input of the error amplifier 173 is connected to the output of the error amplifier 173.

The inverted input of the error amplifier 173 is also connected to power the first, second, third, fourth, fifth, and sixth inverters 202, 204, 206, 208, 210, and 212. The first, second, third, fourth, fifth, and sixth inverters 202, 204, 206, 208, 210, and 212 are grounded by the first ground 192.

An input of the first inverter 202 is connected to the drains of MP9 118 and MN5 138, and accordingly, receives/Bit0. An input of the second inverter 204 is connected to the drains of MP10 120 and MN8 144, and accordingly, receives/Bit1. An input of the third inverter 206 is connected to the drains of MP11 122 and MN11 150, and accordingly, receives/Bit2. An input of the fourth inverter 208 is connected to the drains of MP12 124 and MN14 156, and accordingly, receives/Bit3. An input of the fifth inverter 210 is connected to the drains of MP13 126 and MN17 162, and accordingly, receives/Bit4. An input of the sixth inverter 212 is connected to the drains of MP14 128 and MN20 168, and accordingly, receives/Bit5.

The level shifter includes six inputs, six outputs, two voltage supply inputs that are electrically isolated from each other, and two ground connections that are electrically isolated from each other. The first voltage supply input is connected to the output of the second error amplifier 173, and the second voltage supply input receives $V_{IN}$. The first ground connection is connected to the first ground 192, and the second ground connection is connected to the second ground 216. The level shifter 214 shifts signals received at its inputs from a voltage regime corresponding to the first voltage input and the first ground connection to a voltage regime corresponding to the second voltage input and the second ground connection.

The first inverter 202 outputs a signal, to a first input of the level shifter 214, with a voltage corresponding to a logical inverse of/Bit0. The second inverter 204 outputs a signal, to a second input of the level shifter 214, with a voltage corresponding to a logical inverse of/Bit1. The third inverter 206 outputs a signal, to a third input of the level shifter 214, with a voltage corresponding to a logical inverse of/Bit2. The fourth inverter 208 outputs a signal, to a fourth input of the level shifter 214, with a voltage corresponding to a logical inverse of/Bit3. The fifth inverter 210 outputs a signal, to a fifth input of the level shifter 214, with a voltage corresponding to a logical inverse of/Bit4. The sixth inverter 212 outputs a signal, to a sixth input of the level shifter 214, with a voltage corresponding to a logical inverse of/Bit5.

The level shifter 214 outputs level shifted, non-inverted signals corresponding to/Bit0, /Bit1, /Bit2, /Bit3, /Bit4, and/Bit5. This means that the level shifter 214 outputs Bit0, Bit1, Bit2, Bit3, Bit4, and Bit5. These signals can be described as bits of a digital output, or code, and more particularly of a thermometer code. Accordingly, the ADC 100 and output circuit 200 together covert an analog $V_{IN}$ signal to a digital signal corresponding to Bit0, Bit1, Bit2, Bit3, Bit4, and Bit5, which can be represented as (Bit5 Bit4 Bit3 Bit2 Bit1 Bit0). A minimum output code of the ADC 100 and output circuit 200 is 000000, a next higher code is 000001, then 000011, and so on, so that a maximum output code is 111111.

In some examples, in DC-DC voltage regulators, voltage supply monitoring enables precise adjustment of switching cycle times to maintain a constant peak current through an inductor. These switching cycle times may be referred to as $T_{ON}$ and $T_{OFF}$, and correspond to control switch turn on duration and turn off duration in a switching cycle. In low dropout (LDO) regulators, voltage monitoring enables fine-tuning compensation capacitors to enhance stability. In some examples, thermometer coding enables reduced sensitivity to signal interference. Also, thermometer coding corresponds to relatively simple circuitry for decoding, which reduces design time and area budget requirements for integration of voltage monitoring into digital control loops or processing units.

Figure 3:
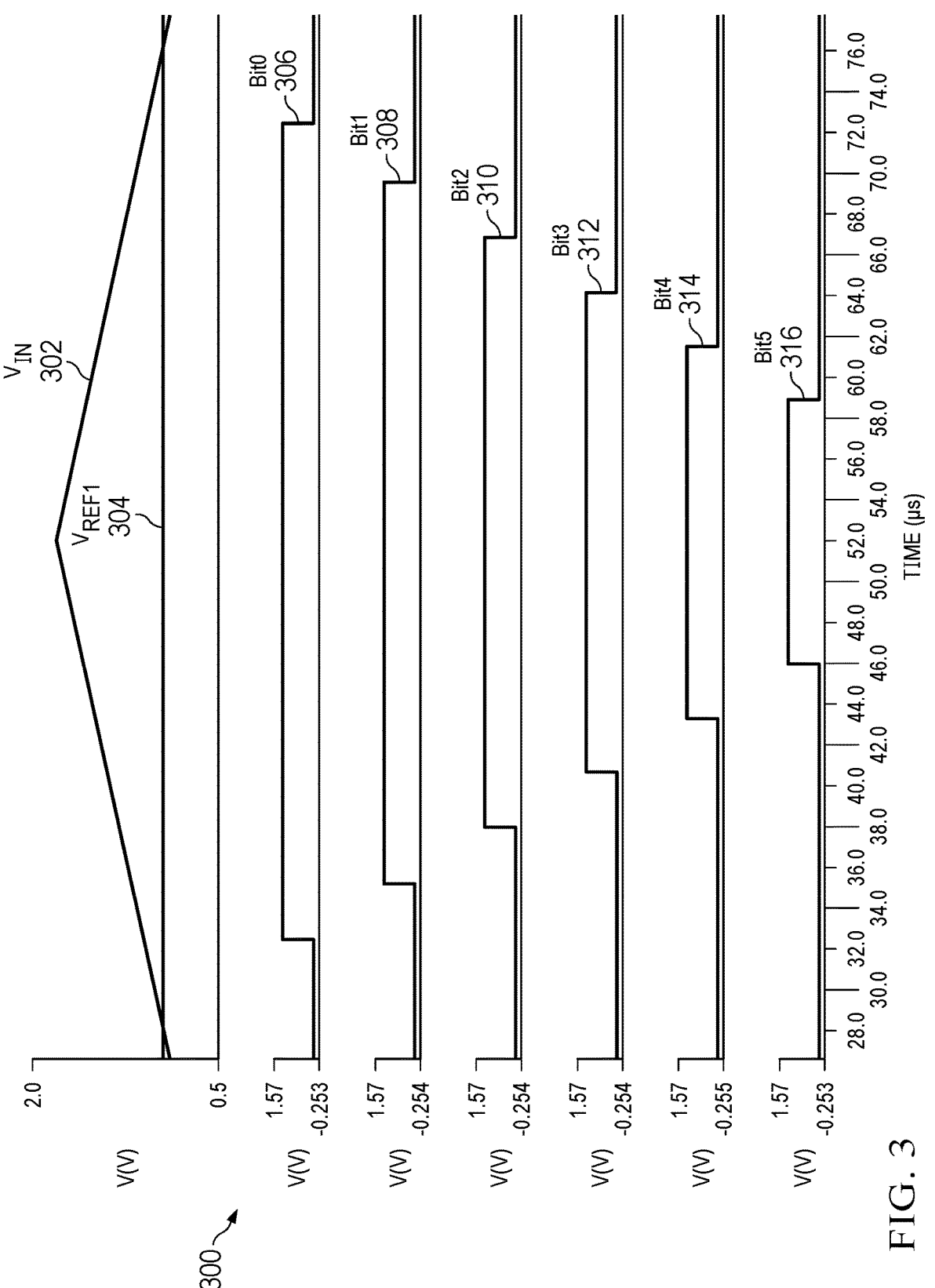
FIG. 3 is a graph of example signal levels of the ADC of FIG. 1 and the output circuit of FIG. 2.

FIG. 3 is a graph 300 of example signal levels of the ADC 100 of FIG. 1 and the output circuit 200 of FIG. 2. In the illustrated example, $V_{in}$ is swept from a minimum (corresponding to an output code of 000000), to a maximum (corresponding to an output of 111111), and then down again to the minimum. Accordingly, in FIG. 3, the horizontal axis is time, and each vertical axis is a respective voltage range. The graph 300 includes a $V_{IN}$ curve 302, a $V_{REF1}$ curve 304, a Bit0 curve 306, a Bit1 curve 308, a Bit2 curve 310, a Bit3 curve 312, a Bit4 curve 314, and a Bit5 curve 316. In an example, the constant $V_{REF1}$ curve 304 equals one volt. The Bit0, Bit1, Bit2, Bit3, Bit4, and Bit5 curves 306, 308, 310, 312, 314, and 316 show voltage values at, respectively, the first, second, third, fourth, fifth, and sixth inputs of the level shifter 214. Accordingly, they equal either zero volts, corresponding to logical zero, or $V_{REF1}$, corresponding to logical one.

$I_1$ is proportional to $V_{IN}$. Each bit curve, evenly numbered 306 through 316, is zero, unless its respectively compared current is driven sufficiently high by $V_{IN}$. Specifically, the Bit0 curve 306 equals $V_{REF1}$ only while $V_{IN}$ is sufficient so that $I_1 > I_2$. The Bit1 curve 308 equals $V_{REF1}$ only while $V_{IN}$ is sufficient so that $I_1 - I_2 > I_2$. The Bit2 curve 310 equals $V_{REF1}$ only while $V_{IN}$ is sufficient so that $I_1 - 2 \times I_2 > I_2$. The Bit3 curve 312 equals $V_{REF1}$ only while $V_{IN}$ is sufficient so that $I_1 - 3 \times I_2 > I_2$. The Bit4 curve 314 equals $V_{REF1}$ only while $V_{IN}$ is sufficient so that $I_1 - 4 \times I_2 > I_2$. The Bit5 curve 316 equals $V_{REF1}$ only while $V_{IN}$ is sufficient so that $I_1 - 5 \times I_2 > I_2$. Recall that $I_1 = (V_{IN} - V_{REF1})/R1$. In the illustrated example, $V_{REF1}$ equals 1.0 volts (V), and transitions of Bit0 through Bit5 from logical zero to logical one occur at $V_{IN}$ equal to, respectively, 1.1 V, 1.2 V, 1.3 V, 1.4 V, 1.5 V, and 1.6 V. Accordingly, each increase in $V_{IN}$, above 1.0 V, of 0.1 V causes $I_1$ to increase by an amount equal to $I_2$, and causes another output bit to change state from logic zero to logic one.

Figure 4:
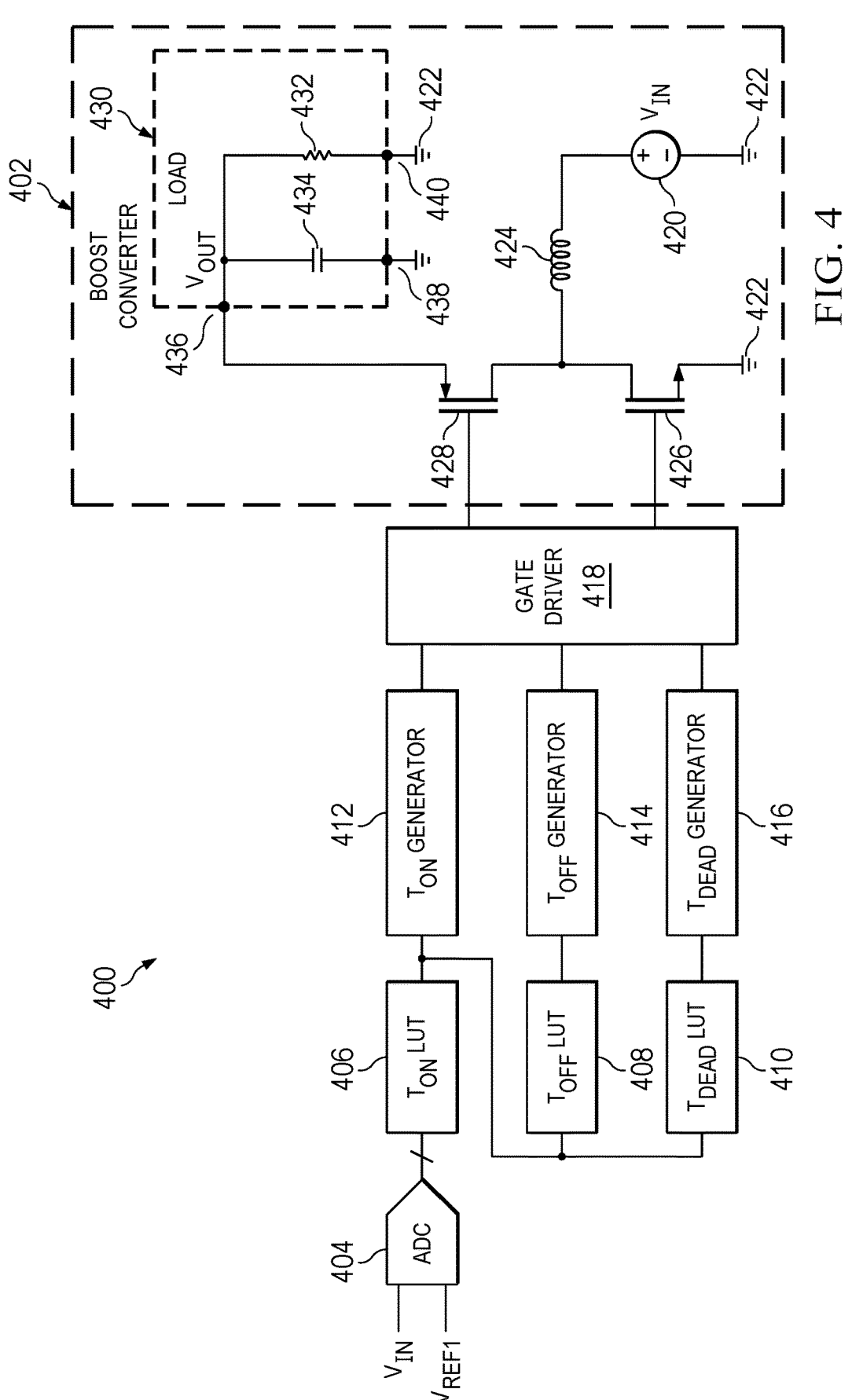
FIG. 4 is an example functional block diagram of an example system including the ADC of FIG. 1.

FIG. 4 is an example functional block diagram of an example voltage regulator system 400 including the ADC 100 of FIG. 1. The voltage regulator system 400 includes a boost converter 402 or other voltage regulator, an ADC 404 such as the ADC 100 of FIG. 1 with the output circuit 200 of FIG. 2, an on time ($T_{ON}$) lookup table (LUT) circuit 406, an off time ($T_{OFF}$) LUT circuit 408, a dead time ($T_{DEAD}$) LUT circuit 410, a $T_{ON}$ generator 412, a $T_{OFF}$ generator 414, a $T_{DEAD}$ generator 416, and a gate driver 418. The boost converter 402 includes a voltage source 420 providing $V_{IN}$, a ground 422, an inductor 424, an NMOS 426, a PMOS 428, and a load 430. The load 430 includes a resistor 432 or other resistance, and a capacitor 434 or other capacitance.

A first input of the ADC 404 receives $V_{IN}$, and a second input of the ADC 404 receives $V_{REF1}$. A (multibit) output of the ADC 404 is connected to an input of the $T_{ON}$ LUT circuit 406. An output of the $T_{ON}$ LUT circuit 406 is connected to an input of the $T_{OFF}$ LUT circuit 408, an input of the $T_{DEAD}$ LUT circuit 410, and an input of the $T_{ON}$ generator 412. An output of the $T_{OFF}$ LUT circuit 408 is connected to an input of the $T_{OFF}$ generator 414, and an output of the $T_{DEAD}$ LUT circuit 410 is connected to an input of the $T_{DEAD}$ generator 416. Outputs of the $T_{ON}$ generator 412, $T_{OFF}$ generator 414, and $T_{DEAD}$ generator 416 are respectively connected to first, second, and third inputs of the gate driver 418. A first output of the gate driver 418 is connected to a gate of the NMOS 426, and a second output of the gate driver 418 is connected to a gate of the PMOS 428.

A negative terminal of the voltage source 420 is connected to ground 422, and a positive terminal of the voltage source 420 is connected to a first terminal of the inductor 424. A second terminal of the inductor 424 is connected to drains of the NMOS 426 and of the PMOS 428. A source of the NMOS 426 is connected to ground 422. A source of the PMOS 428 is connected to a first terminal 436 of the load 430. A second terminal 438 of the load 430 is connected to ground 422. The first terminal 436 of the load 430 is connected to a first terminal of the resistor 432 and a first terminal of the capacitor 434. Second terminals of the resistor 432 and of the capacitor 434 are connected to the second terminal 438 of the load 430.

In some examples, operation of the ADC 404 is as discussed with respect to the ADC 100 and output circuit 200. The output circuit 200 provides the described output code to the $T_{ON}$ LUT circuit 406, which outputs a control signal for the $T_{ON}$ generator 412 responsive to the output code. The $T_{OFF}$ LUT circuit 408 and the $T_{DEAD}$ LUT circuit 410 provide control signals for the $T_{OFF}$ generator 414 and the $T_{DEAD}$ generator 416, respectively, in response to this control signal. In some examples, the $T_{OFF}$ LUT circuit 408 and the $T_{DEAD}$ LUT circuit 410 provide control signals in response to the output code.

The $T_{ON}$ generator 412 provides a control signal to the gate driver 418 to determine $T_{ON}$ of the boost converter 402 in response to the control signal received from the $T_{ON}$ LUT circuit 406. $T_{ON}$ of the boost converter 402 corresponds to a portion of a switching cycle of the boost converter 402 during which the NMOS 426 is turned on, and the PMOS 428 is turned off, and so that the inductor 424 is charged with a designed, selected, or otherwise determined peak current.

The $T_{OFF}$ generator 414 provides a control signal to the gate driver 418 to determine $T_{OFF}$ of the boost converter 402 in response to the control signal received from the $T_{OFF}$ LUT circuit 408. $T_{OFF}$ of the boost converter 402 corresponds to a portion of a switching cycle of the boost converter 402 during which the PMOS 428 is turned ON, the NMOS 426 is turned off, and current is provided to the load 430.

The $T_{DEAD}$ generator 416 provides a control signal to the gate driver 418 to determine $T_{DEAD}$ of the boost converter 402 in response to the control signal received from the $T_{DEAD}$ LUT circuit 410. $T_{DEAD}$ of the boost converter 402 corresponds to a portion of a switching cycle of the boost converter 402 during which the NMOS 426 and PMOS 428 are turned off to prevent shoot-through while switching between $T_{ON}$ and $T_{OFF}$.

Figure 5:
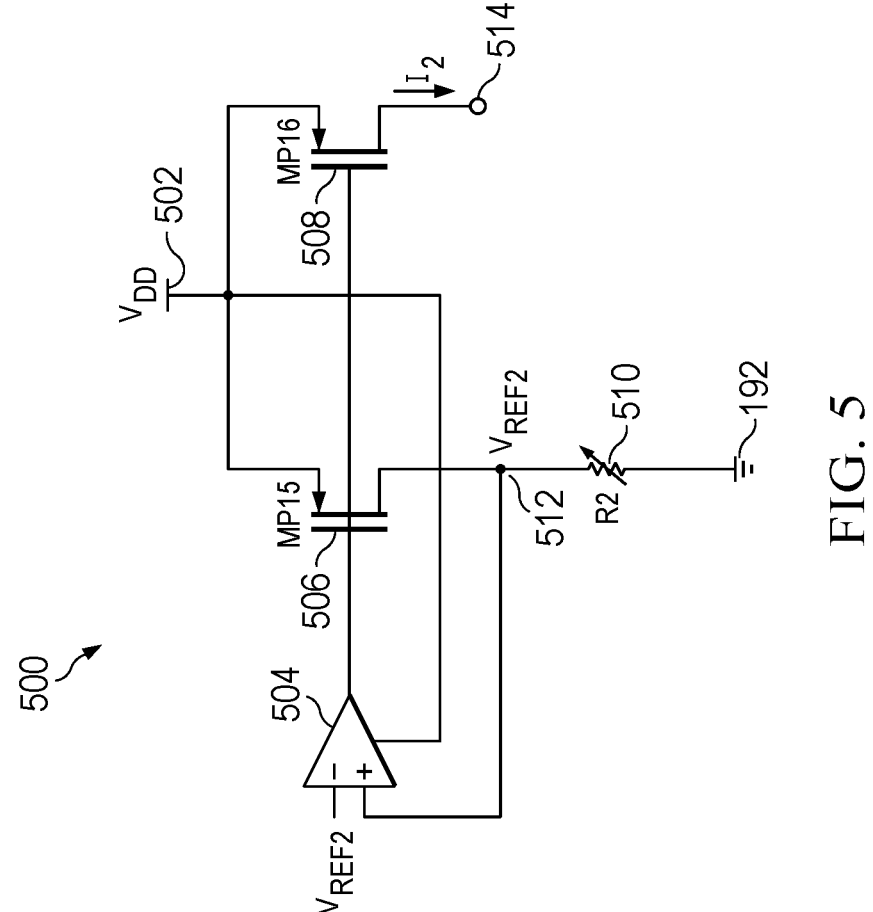
FIG. 5 shows a circuit diagram of an example of the current source of FIG. 1.

FIG. 5 shows a circuit diagram of an example of the current source 176 of FIG. 1. The current source 176 includes a voltage source 502 providing a source voltage ($V_{DD}$), an error amplifier 504, a fifteenth p-channel MOS-FET (MP15) 506, a sixteenth p-channel MOSFET (MP16) 508, a variable resistor 510 having the resistance R2, a feedback node 512, and an output terminal 514. In some examples, the variable resistor 510 is trimmed using similar considerations as the variable resistor 174 (FIG. 1).

An inverting input of the error amplifier 504 receives $V_{REF2}$, for example, from a bandgap voltage reference. A bias terminal of the error amplifier 504 is connected to the voltage source 502 to receive a bias current. The voltage source 502 is also connected to a source of MP15 506 and a source of MP16 508. A gate of MP15 506 and a gate of MP16 508 are connected to an output of the error amplifier 504.

A drain of MP15 506 is connected to the feedback node 512. The feedback node 512 is connected to a non-inverting input of the error amplifier 504 and a first terminal of the variable resistor 510. A second terminal of the variable resistor 510 is connected to ground 192. A drain of MP16 508 is connected to the output terminal of the current source 176. The output terminal of the current source 176 corresponds to the second terminal of the current source 176, which is connected to the drain and gate of MN1 130 and the gates of the other n-channel MOSFETs shown in FIG. 1.

MP15 506 and MP16 508 are matched transistors, so that their current responses match. Accordingly, a multiple of the current that flows through MP15 506 flows through MP16 508. In some examples, (such as the illustrated example) the inverting input of the error amplifier 504 receives $V_{REF2}$, and the multiplier equals one. In some examples, the non-inverting input of the error amplifier 504 receives a voltage other than (for example, smaller than) $V_{REF2}$, such as a bandgap voltage, and the multiple is larger than one.

The output of the error amplifier 504 sets a voltage at the feedback node 512 equal to the voltage at the inverting input of the error amplifier 504. Accordingly, the current through the variable resistor 510 equals the voltage at the feedback node 512 divided by R2. The current provided to the output terminal 514 equals the voltage at the feedback node 512 divided by R2, multiplied by the multiplier. And $V_{REF2}$ equals the voltage received by the non-inverting input of the error amplifier 504 multiplied by the multiplier.

Modifications are possible in the described examples, and other examples are possible within the scope of the claims.

In some examples, voltage measurement as described herein is used for control loops in alternating current to direct current (AC-DC) circuits.

In some examples, the first current is responsive to a difference between a first voltage and a second voltage.

In some examples, MP1 102 is not included and the output of the first error amplifier 172 is connected to the gates of MP2 104, MP3 106, MP4 108, MP5 110, MP6 112, MP7 114, and MP8 116, and the drain of MN3 134.

In some examples, MP9 118, MN5 138, and MN6 140 can together be described as an output circuit. In some examples, MP10 120, MN8 144, and MN9 146 can together be described as an output circuit. In some examples, MP11 122, MN11 150, and MN12 152 can together be described as an output circuit. In some examples, MP12 124, MN14 156, and MN15 158 can together be described as an output circuit. In some examples, MP13 126, MN17 162, and MN18 164 can together be described as an output circuit. In some examples, MP14 128, MN20 168, and MN20 170 can together be described as an output circuit.

In some examples, current comparisons can be described as $I_1$ or a remainder current being sourced to a corresponding node, and $I_2$ being sunk from that node.

In some examples, different numbers of output lines, and corresponding numbers of output bits, are used than in the described examples.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples may be included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

What is claimed is:

1. A circuit comprising:

a first current source having a terminal and configured to provide a first current at the terminal;

a second current source having a terminal and configured to provide a second current at the terminal;

an operational amplifier (op-amp) having a first input, a second input, and an output;

multiple first transistors each having a first terminal, a second terminal, and a gate, the gates of the first transistors coupled together, and the first terminal of a first one of the first transistors coupled to the second input of the op-amp and the terminal of the first current source;

a second transistor having a first terminal, a second terminal, and a gate; and multiple third transistors each having a first terminal, a second terminal, and a gate, the gates of the third transistors coupled to the first terminal and the gate of the second transistor and to the terminal of the second current source, the first terminals of the third transistors coupled to second terminals of corresponding ones of the first transistors, and the second terminals of the third transistors coupled together;

wherein the first transistors are coupled in series between the terminal of the first current source and the first terminal of one of the third transistors, so that first terminals of first transistors other than the first one of the first transistors are coupled to second terminals of respective ones of the first transistors.

2. The circuit of claim 1, wherein each of the first transistors has a bulk terminal coupled to the second input of the op-amp and the terminal of the first current source.

3. The circuit of claim 1, further including:

multiple fourth transistors each having a first terminal, a second terminal, and a gate, gates of respective ones of the fourth transistors coupled to second terminals of corresponding ones of the first transistors and first terminals of corresponding ones of the third transistors; and multiple fifth transistors each having a first terminal, a second terminal, and a gate, the gates of the fifth transistors coupled to the gates of the third transistors, the first terminals of respective ones of the fifth transistors coupled to second terminals of corresponding ones of the fourth transistors, and the second terminals of the fifth transistors coupled to the second terminals of the third transistors.

4. The circuit of claim 3, wherein the op-amp is a first op-amp;

further comprising a second op-amp having a first terminal, a second terminal, and an output, the first terminal and the output of the second op-amp coupled to the first terminals of the fourth transistors.

5. The circuit of claim 1, further including a fourth transistor having a first terminal, a second terminal, and a gate, the gate of the fourth transistor coupled to the gates of the first transistors, and the first terminal of the fourth transistor coupled to the second input of the op-amp and the terminal of the first current source.

6. The circuit of claim 1, wherein the first current source includes a first resistor and the first current source is configured to generate the first current in response to a resistance of the first resistor;

wherein the second current source includes a second resistor and the second current source is configured to generate the second current in response to a resistance of the second resistor; and wherein the first and second resistors are a same type of resistor.

7. A circuit comprising:

a first subcircuit configured to receive a first current, and in response to the first current being greater than a first reference current, provide a second current and a first output signal, wherein the second current is a difference between the first current and the first reference current; and a second subcircuit coupled to the first subcircuit, wherein the second subcircuit is configured to receive the second current, and in response to the second current being greater than the first reference current, provide a third current and a second output signal, wherein the third current is a difference between the second current and the first reference current.

8. The circuit of claim 7, wherein the first current is responsive to a first voltage, a second voltage, and a resistance of a first resistor; and wherein the first reference current is responsive to a third voltage and a resistance of a second resistor.

9. The circuit of claim 8, wherein the first voltage is responsive to negative feedback of an operational amplifier.

10. The circuit of claim 7, wherein the first subcircuit is configured to provide a first logic value as the first output signal in response to the first current being greater than the first reference current.

11. The circuit of claim 7, further including:

a control circuit coupled to the first and second subcircuits; and a gate driver configured to couple to a voltage regulator;

wherein the control circuit is coupled to the gate driver, and the control circuit is configured to receive the first and second output signals and control the gate driver based on the first and second output signals.

12. A system comprising:

an analog to digital converter including:

a first current source having a terminal and configured to provide a first current at the terminal;

a second current source having a terminal and configured to provide a second current at the terminal;

an operational amplifier (op-amp) having a first input, a second input, and an output;

a first transistor having a first terminal coupled to the terminal of the first current source, a second terminal, and a gate;

a second transistor having a first terminal coupled to the second terminal of the first transistor, a second terminal, and a gate coupled to the gate of the first transistor;

a third transistor having a first terminal, a second terminal, and a gate;

a fourth transistor having a first terminal coupled to the second terminal of the first transistor, a second terminal, and a gate coupled to the first terminal and the gate of the third transistor and to the terminal of the second current source;

a fifth transistor having a first terminal coupled to the second terminal of the second transistor, a second terminal coupled to the second terminal of the fourth transistor, and a gate coupled to the first terminal and the gate of the third transistor and to the terminal of the second current source; and an output circuit having a first control terminal coupled to the second terminal of the first transistor, a second control terminal coupled to the second terminal of the second transistor, a first output terminal, and a second output terminal;

a control circuit including a first input coupled to the first output terminal of the output circuit, a second input coupled to the second output terminal of the output circuit, and an output;

a gate driver including an input and an output, the input of the gate driver coupled to the output of the control circuit; and a voltage regulator including a switch having a control terminal, the control terminal of the switch coupled to the output of the gate driver.

13. The system of claim 12, wherein the output circuit includes:

a sixth transistor having a first terminal, a second terminal, and a gate, the gate of the sixth transistor coupled to the first control terminal of the output circuit; and a seventh transistor having a first terminal, a second terminal, and a gate, the gate of the seventh transistor coupled to the first terminal and the gate of the third transistor and to the terminal of the second current source, the first terminals of the seventh transistor coupled to the second terminal of the sixth transistor and to the first output terminal of the output circuit, and the second terminal of the seventh transistor coupled to the second terminal of the fourth transistor.

14. The system of claim 12, wherein the voltage regulator is a boost converter;

further including a bandgap voltage reference configured to generate a reference voltage;

wherein the first current source generates the first current in response to an input voltage of the boost converter; and wherein the second current source generates the second current in response to the reference voltage.

15. The system of claim 12, wherein the voltage regulator is a boost converter;

further including:

a first bandgap voltage reference configured to generate a first reference voltage;

a second bandgap voltage reference configured to generate a second reference voltage;

a first resistor; and a second resistor;

wherein a difference voltage is a difference between an input voltage of the boost converter and the first reference voltage, and the first current source is configured to generate the first current in response to the difference voltage applied across the first resistor; and wherein the second current source is configured to generate the second current in response to the second reference voltage applied across the second resistor.

16. The system of claim 12, wherein the voltage regulator is a buck converter;

further including a bandgap voltage reference configured to generate a reference voltage;

wherein the first current source generates the first current in response to an input voltage of the buck converter and an output voltage of the buck converter; and wherein the second current source generates the second current in response to the reference voltage.

17. The system of claim 12, wherein the voltage regulator is a buck converter;

further including:

a bandgap voltage reference configured to generate a reference voltage;

a first resistor; and a second resistor;

wherein a difference voltage is responsive to an input voltage of the buck converter and an output voltage of the buck converter, and the first current source is configured to generate the first current in response to the difference voltage applied across the first resistor; and wherein the second current source is configured to generate the second current in response to the reference voltage applied across the second resistor.

18. The system of claim 12, wherein the first current source includes a first resistor and the first current source is configured to generate the first current in response to a resistance of the first resistor;

wherein the second current source includes a second resistor and the second current source is configured to generate the second current in response to a resistance of the second resistor; and wherein the first and second resistors are a same type of resistor.

19. The circuit of claim 7, wherein the first and second subcircuits are configured to provide the first and second output signals sequentially.

20. The circuit of claim 7, wherein the circuit is an analog to digital converter (ADC).

* * * * *